(12) United States Patent
Brgoch et al.

(10) Patent No.: US 12,297,384 B2
(45) Date of Patent: May 13, 2025

(54) NARROW GREEN-EMITTING PHOSPHORS

(71) Applicant: University of Houston System, Houston, TX (US)

(72) Inventors: Jakoah Brgoch, Houston, TX (US); Ya Zhuo, Houston, TX (US)

(73) Assignee: University of Houston System, Houston, TX (US)

( * ) Notice: Subject to any disclaimer, the term of this patent is extended or adjusted under 35 U.S.C. 154(b) by 509 days.

(21) Appl. No.: 17/629,194

(22) PCT Filed: Jul. 23, 2020

(86) PCT No.: PCT/US2020/043167
§ 371 (c)(1),
(2) Date: Jan. 21, 2022

(87) PCT Pub. No.: WO2021/016411
PCT Pub. Date: Jan. 28, 2021

(65) Prior Publication Data
US 2022/0290045 A1  Sep. 15, 2022

Related U.S. Application Data

(60) Provisional application No. 62/877,603, filed on Jul. 23, 2019.

(51) Int. Cl.
*C09K 11/77* (2006.01)
*H10H 20/851* (2025.01)
*H10H 20/01* (2025.01)

(52) U.S. Cl.
CPC ....... *C09K 11/774* (2013.01); *H10H 20/8513* (2025.01); *H10H 20/0361* (2025.01)

(58) Field of Classification Search
CPC  C09K 11/774; H01L 33/504; H10H 20/8513; H10H 20/0361
See application file for complete search history.

(56) References Cited

U.S. PATENT DOCUMENTS

| | | | |
|---|---|---|---|
| 6,555,958 | B1 | 4/2003 | Srivastava et al. |
| 6,682,207 | B2 | 1/2004 | Weber et al. |
| 7,088,038 | B2 | 8/2006 | Srivastava et al. |
| 7,489,073 | B2 | 2/2009 | Fiedler et al. |
| 10,177,287 | B1 | 1/2019 | Melman et al. |

FOREIGN PATENT DOCUMENTS

| | | |
|---|---|---|
| CN | 102199426 A | 9/2011 |
| CN | 106190119 A | 12/2016 |

OTHER PUBLICATIONS

Ge et al., Physical Chemistry, 1$^{st}$ version, *Press of University of Science and Technology of China*, Aug. 31, 2014.
(Continued)

*Primary Examiner* — Jessee R Roe
(74) *Attorney, Agent, or Firm* — Parker Highlander PLLC

(57) ABSTRACT

Provided herein are phosphors of the formula: $(A_{1-x}Eu_x)(Ba_{1-y}Sr_y)B_9O_{15}$, wherein the variables are as defined herein. Methods of producing the phosphors are also provided. In some aspects, the present disclosure provides light-emitting devices comprising these phosphors.

27 Claims, 8 Drawing Sheets

(56) References Cited

OTHER PUBLICATIONS

Liu et al., "Study on synthesis, optimization and concentration quenching mechanism of deep-blue-emitting $BaNa(B_3O_5)_3:Eu^{2+}$ phosphor", *Optik*, 154, pp. 421-427, 2018.

Zhao et al., Examples of Preparation and Characterization of Zinc Oxide and aluminum Nitride Film, 1st version, *Metallurgical Industry Press*, Jun. 30, 2015.

Zhuo et al., "Identifying an efficient, thermally robust inorganic phosphor host via machine learning", *Nature Communications*, vol. 9, p. 4377, 2018.

Hirosaki et al., "Characterization and properties of green-emitting ß-SiAlOn:$Eu^{2+}$" *Applied Physics Letters*, 86, 211905, 2005.

International Search Report and Written Opinion for PCT/US2020/043167 dated Oct. 14, 2020, 8 pages.

Penin et al., "Synthesis and crystal structure of three MM' B9015 borates (M-Ba, Sr and M'_L; M=Ba and M'=Na)", *International Journal of Inorganic Materials*, 105-1023, XP055735994, Jan. 1, 2001.

Yang et al., "Green phosphor for low-voltage cathodoluminescent applications: $SrGa_2S_4:EU^{2+}$", *Applied Physics Letters*, 72, 158, 1998.

Zhang et al. "Optical properties of $Ba_2Sio_4:Eu^{2+}$ phosphor for green-emiting diode (LED)" *Materials Research Bulletin*, 42, 33-29, 2007.

Zhao et al., "Next-generation narrow-band green-emitting $RbLi(Li_3SiO_4)_2$: $Eu^{2+}$ phosphor for backlight display application", *Advanced Materials*, 30, 1802489, 2018.

Zhou et al. "Identifying an efficient, thermally robust inorganic phosphor host via machine learning", *Nature Communications*, 9(1):Xp055735986, Oct. 22, 2018.

Brgoch et al., "Tuning luminescent properties through solid-solution in $(Ba_{1-x}Sr_x)_9Sc_2Si_6O_{24}:Ce^{3+},Li^+$", *Solid State Sciences*, 18, 149-165, 2013.

Jung et al., "Effect of monovalent charge compensators on the photoluminescence properties of $Ca_3(PO_4)_2:Tb^{3+},A^+$(A=Li, Na, K) phosphors", *Journal of Materials Science & Technology*, 82 187-196, 2021.

Van Der Voort et al., "The Luminescence of Europium (III) in Calcium Sulfate: Activators with an Effective Charge", *Journal of Solid State Chemistry*, 87, 350-359, 1990.

NARROW GREEN-EMITTING PHOSPHORS

This application is a national phase application under 35 U.S.C. § 371 of International Application No. PCT/US2020/043167, filed Jul. 23, 2020, which claims the benefit of priority to U.S. Provisional Application No. 62/877,603, filed on Jul. 23, 2019, the entire contents of each of which are hereby incorporated by reference.

BACKGROUND OF THE INVENTION

I. Field of the Invention

The present invention relates generally to the fields of chemistry and physics. More particularly, it concerns phosphors that emit a narrow band of light as well as methods of making and light-emitting devices comprising said phosphors.

II. Description of Related Art

Replacing a traditional light bulb with an energy-efficient, phosphor-converted white light emitting diode (pc-LED) is one of the easiest and most promising methods to decrease electricity consumption dramatically. The color gamut is determined by the red/green/blue (RGB) phosphors that fabricated in the LED devices. It is crucial to develop phosphors with proper optical properties to fulfill the application. Typically, the white emitting LED combines a near-UV emitting LED chip with $\beta$-SiAlON:Eu$^{2+}$ as the green source, BaMgAl$_{10}$O$_{17}$:Eu$^{2+}$ as the blue source, and K$_2$SiF$_6$:Mn$^{4+}$ as the red source. Alternatively, it is possible to use a blue emitting LED chip along with a similar green source and similar red source. The discovery and development of efficient narrow green-emitting phosphors is of high importance as human eyes are more sensitive to green light than red and blue.

Presently, only a few green phosphors are able to fulfill the commercial application, such as $\beta$-SiAlON:Eu$^{2+}$ and Ba$_{1.14}$Sr$_{0.86}$SiO$_4$:Eu$^{2+}$, among others. Although $\beta$-SiAlON:Eu$^{2+}$ is among the narrowest commercial green phosphors, its emission coordinates limit the maximum accessible color gamut. Moreover, another drawback is its harsh synthesis condition as it needs a high-pressure synthesis. In contrast, Ba$_{1.14}$Sr$_{0.86}$SiO$_4$:Eu$^{2+}$ is simple to make under normal atmospheric pressure. However, the broad emission band forbids its possibility of being widely used, in particular for display application. Also, the silicate efficiency drops fast at elevated temperature. Therefore, new inorganic solid-state rare earth phosphors with easily accessible synthesis conditions, narrow green emission, and excellent thermal stability are an urgent need.

SUMMARY OF THE INVENTION

The present disclosure provides phosphors that efficiently and narrowly emit green light, methods for their manufacture, and light-emitting devices comprising said phosphors. In some embodiments, the phosphors provided herein emit green light in a narrower band than other phosphors in the art. The methods of producing the phosphors provided herein may be performed at atmospheric pressure and may be performed in air. The phosphors provided herein may possess emission coordinates that provide a color gamut more suitable to lighting applications than phosphors in the art. In some embodiments, the phosphors may be used in lighting applications. In some embodiments, the phosphors may be used for converting UV light to green light for use with a light-emitting diode (LED), laser diode (LD), or liquid crystal display (LCD), and a lighting or display apparatus employing the same.

In some aspects, the present disclosure provides phosphors of the general molecular formula:

$(A_{1-x}Eu_x)(Ba_{1-y}Sr_y)B_9O_{15}$, wherein:
A is one or more alkali metal;
$0<x\leq0.25$; and
$0\leq y\leq1$.

In some embodiments, A is a single alkali metal. In some embodiments, A is sodium. In some embodiments, A is sodium (I). In some embodiments, $0\leq y\leq0.75$. In further embodiments, $0\leq y\leq0.50$. In still further embodiments, $0\leq y\leq0.25$. In some embodiments, y is 0. In some embodiments, $0<x\leq0.15$. In some embodiments, $0<x\leq0.10$. In some embodiments, $0<x\leq0.05$. In some embodiments, x is 0.03. In some embodiments, the phosphor is further defined as Na$_{0.97}$Eu$_{0.03}$BaB$_9$O$_{15}$. In some embodiments, a crystalline sample of the phosphor has a space group of R3c. In some embodiments, the phosphor has a decay time ($\tau$) of from about 0.500 μs to about 1.500 μs. In some embodiments, $\tau$ is from about 1.000 μs to about 1.200 μs. In some embodiments, $\tau$ is about 1.103 μs. In some embodiments, the phosphor has an excitation spectrum peak at an excitation wavelength from about 350 nm to about 450 nm. In some embodiments, the excitation wavelength is from about 370 nm to about 435 nm. In some embodiments, the excitation wavelength is from about 390 nm to about 425 nm. In some embodiments, the excitation wavelength is from about 385 nm to about 405 nm. In some embodiments, the excitation wavelength is about 395 nm. In some embodiments, the excitation wavelength is from about 420 nm to about 440 nm. In some embodiments, the excitation wavelength is about 430 nm. In some embodiments, the phosphor has an emission spectrum peak at an emission wavelength from about 400 nm to about 650 nm. In some embodiments, the emission wavelength is from about 450 nm to about 550 nm. In some embodiments, the emission wavelength is from about 500 nm to about 525 nm. In some embodiments, the emission wavelength is about 515 nm. In some embodiments, the emission spectrum peak has a full width at half-maximum (FWHM) of from about 50 nm to about 90 nm. In some embodiments, the FWHM is from about 55 nm to about 75 nm. In some embodiments, the FWHM is from about 60 nm to about 70 nm. In some embodiments, the FWHM is about 64 nm. In some embodiments, the phosphor has a photoluminescence quantum yield (PLQY) greater than about 50%. In some embodiments, the phosphor has a PLQY is about 58%. In some embodiments, the phosphor has a PLQY greater than about 60%. In some embodiments, the phosphor has a PLQY greater than about 70%. In some embodiments, the PLQY is greater than about 80%. In some embodiments, the PLQY is about 87%.

In other aspects, the present disclosure provides methods for producing a phosphor of the present disclosure, wherein the method comprises:
a) mixing starting materials of the phosphor to produce a first reaction mixture;
b) heating the first reaction mixture to produce the phosphor.

In some embodiments, heating the first reaction mixture comprises irradiating with microwave radiation. In some embodiments, the frequency of the microwave radiation is from about 500 MHz to about 4400 MHz. In some embodiments, the frequency of the microwave radiation is from about 1000 MHz to about 3900 MHz. In some embodiments, the frequency of the microwave radiation is from about 2000 MHz to about 2900 MHz, such as about 2450 MHz. In some embodiments, the power of the microwave radiation is from about 120 W to about 1200 W. In some embodiments, the power of the microwave radiation is from about 240 W to about 900 W. In some embodiments, the power of the microwave radiation is from about 360 W to about 600 W, such as about 480 W.

In still other aspects, the present disclosure provides methods for producing a phosphor of the present disclosure, wherein the method comprises:

a) mixing starting materials of the phosphor to produce a first reaction mixture;
b) heating the first reaction mixture to a first temperature to produce a second reaction mixture; and
c) heating the second reaction mixture to a second temperature to produce the phosphor.

In some embodiments, the starting materials of the phosphor comprise one or more alkali metal sources, a barium source, a boron source, and a europium source. In some embodiments, the starting materials of the phosphor comprise a single alkali metal source. In some embodiments, the alkali metal source is a sodium source. In some embodiments, the sodium source is a sodium salt, such as $NaHCO_3$. In some embodiments, the barium source is a barium salt, such as $BaCO_3$. In some embodiments, the boron source is $H_3BO_3$. In some embodiments, the europium source is a europium oxide, such as europium (III) oxide. In some embodiments, heating the first reaction mixture comprises heating in a furnace. In some embodiments, the first temperature is from about 400° C. to 800° C. In some embodiments, the first temperature is from about 500° C. to about 700° C. In some embodiments, the first temperature is from about 550° C. to about 650° C. In some embodiments, the first temperature is about 600° C. In some embodiments, heating the second reaction mixture comprises heating in a furnace. In some embodiments, the second temperature is from about 525° C. to 925° C. In some embodiments, the second temperature is from about 625° C. to about 825° C. In some embodiments, the second temperature is from about 675° C. to about 775° C. In some embodiments, the second temperature is about 725° C.

In some embodiments, mixing is performed in air. In some embodiments, heating the first reaction mixture is performed in air. In some embodiments, heating the first reaction mixture is performed in a reducing atmosphere. In some embodiments, the heating the second reaction mixture is performed in a reducing atmosphere. In some embodiments, the reducing atmosphere comprises $H_2$, CO, or $NH_3$. In some embodiments, the reducing atmosphere comprises CO. In some embodiments, the reducing atmosphere comprises $H_2$. In some embodiments, the reducing atmosphere further comprises a diluent gas. In some embodiments, the diluent gas is $N_2$, helium, neon, argon, krypton, xenon, or any combination thereof. In some embodiments, the reducing atmosphere comprises argon. In some embodiments, the reducing atmosphere comprises $N_2$. In some embodiments, the reducing atmosphere comprises $H_2$ and argon. In some embodiments, the reducing atmosphere comprises $H_2$ and $N_2$. In some embodiments, the reducing atmosphere comprises from about 0.1% to about 25% $H_2$. In some embodiments, the reducing atmosphere comprises from about 1% to about 10% $H_2$. In some embodiments, the reducing atmosphere comprises about 5% $H_2$. In some embodiments, the reducing atmosphere comprises from about 75% to about 99.9% $N_2$. In some embodiments, the reducing atmosphere comprises from about 90% to about 99% $N_2$. In some embodiments, the reducing atmosphere comprises about 95% $N_2$.

In some embodiments, the method further comprises resting the first reaction mixture for at least about 12 hours before heating. In some embodiments, heating the first reaction mixture comprises the method further comprises resting the first reaction mixture for at least about 1 day before heating. In some embodiments, the method further comprises resting the first reaction mixture for at least about 3 days before heating. In some embodiments, the method further comprises resting the first reaction mixture for at least about 4 days before heating. In some embodiments, the method further comprises resting the first reaction mixture for at least about 7 days before heating. In some embodiments, the method further comprises resting the first reaction mixture for about 7 days before heating. In some embodiments, resting is performed in an accelerated aging chamber. In some embodiments, the accelerated aging chamber produces elevated temperature and/or humidity relative to the ambient temperature and/or humidity. In some embodiments, the methods may be performed at atmospheric pressure.

In yet other aspects, the present disclosure provides light-emitting devices comprising:

a) an excitation light source that emits primary light; and
b) a phosphor according to any one of the claims listed below, wherein the phosphor is a green-emitting phosphor.

In some embodiments, the phosphor is a green-emitting phosphor. In some embodiments, the excitation light source is a semiconductor light source, such as a light-emitting diode (LED) or a laser diode (LD). In some embodiments, the primary light has a wavelength from about 380 nm to about 500 nm. In some embodiments, the primary light has a wavelength from about 390 nm to about 425 nm. In some embodiments, the primary light has a wavelength of about 395 nm. In some embodiments, the primary light has a wavelength from about 390 nm to about 435 nm. In some embodiments, the primary light has a wavelength of about 430 nm. In some embodiments, the light-emitting device further comprises a blue-emitting phosphor. In some embodiments, the light-emitting device further comprises a red-emitting phosphor. In some embodiments, the light-emitting device further comprises a blue-emitting phosphor and a red-emitting phosphor.

Other objects, features and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description. Note that simply because a particular compound is ascribed to one particular generic formula doesn't mean that it cannot also belong to another generic formula.

BRIEF DESCRIPTION OF THE DRAWINGS

The following drawings form part of the present specification and are included to further demonstrate certain aspects of the present disclosure. The disclosure may be better understood by reference to one or more of these drawings in combination with the detailed description of specific embodiments presented herein.

FIG. 3A shows the results for Na$_{0.97}$Eu$_{0.03}$BaB$_9$O$_{15}$. FIG. 3B shows the results for NaBaB$_9$O$_{15}$. FIG. 3C shows the result for NaBa$_{0.97}$Eu$_{0.03}$B$_9$O$_{15}$.

FIG. 4A shows the crystal structure viewed in [010] direction with the associated [BaO$_9$], [NaO$_6$], and [B$_3$O$_7$] polyhedral subunits highlighted. FIG. 4B shows the arrangement of the [B$_3$O$_7$]$^{5-}$ units generate large tunnels along the [001] direction, which are alternately filled by Ba$^{2+}$ and Na$^+$.

DESCRIPTION OF ILLUSTRATIVE EMBODIMENTS

Figure 1:
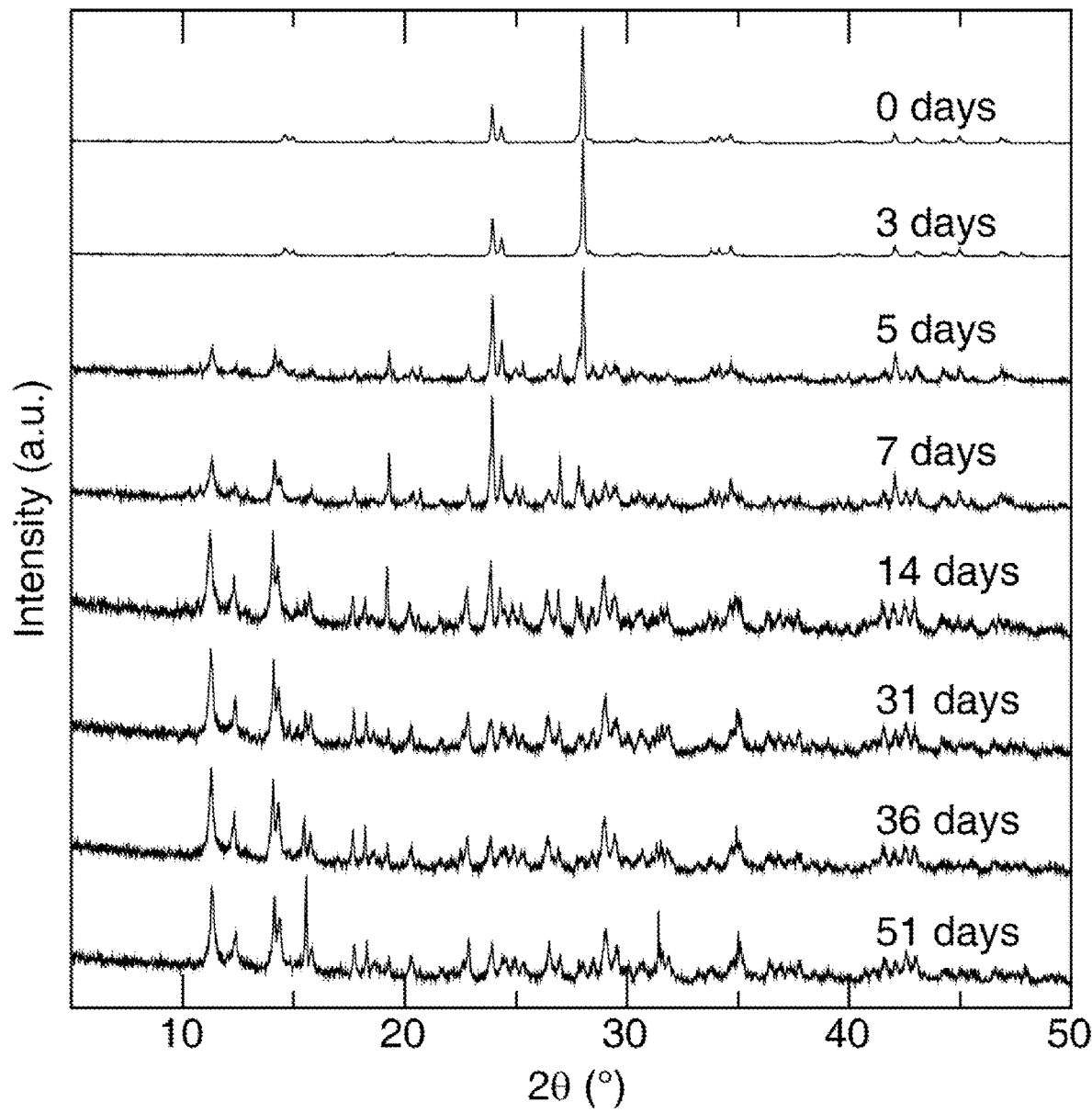
FIG. 1 shows XRD patterns of the initial reaction necessary to make the first reaction mixture. The initial peaks at 0 days correspond to only starting materials whereas ~5 days after the initial mixture the reaction has started as indicated by the change in the diffraction peaks.

Disclosed herein are new phosphors with efficient and narrow light-emission properties, methods for their manufacture, and light-emitting devices comprising said phosphors. In some embodiments, the phosphor emits in the green region of the electromagnetic spectrum when excited with n-UV or blue light. In some embodiments, the phosphors exhibit a narrower emission band than other green phosphors in art. In some embodiments, the phosphors may be synthesized by a simple multi-step high temperature solid-state furnace reaction under normal atmospheric pressure. In other embodiments the phosphors may be synthesized using a rapid microwave-based reaction under normal atmospheric pressure. In some embodiments, the phosphors have a high photoluminescence quantum yield and are thermally robust at elevated temperature. In some embodiments, the phosphors exhibit optical properties suitable for general white illumination. In some embodiments, the phosphor has optical properties suitable for LED backlighting or similar display applications. In some embodiments, the phosphor is Na$_{0.97}$Eu$_{0.03}$BaB$_9$O$_{15}$.

I. Compounds of the Present Invention

The compounds of the present invention (also referred to as "phosphors," "phosphors of the present disclosure" or "phosphors disclosed herein") are shown, for example, above, in the summary of the invention section, in the Examples below, and in the claims below. They may be made using the synthetic methods outlined in the Examples section. These methods can be further modified and optimized using the principles and techniques of inorganic chemistry as applied by a person skilled in the art. Such principles and techniques are taught, for example, in Cotton and Wilkinson, *Advanced Inorganic Chemistry*, (1988), which is incorporated by reference herein. In addition, the synthetic methods may be further modified and optimized for preparative, pilot- or large-scale production, either batch or continuous, using the principles and techniques of process chemistry as applied by a person skilled in the art.

In some embodiments, the compounds of the present invention have the advantage that they may be more efficacious than, more efficient than, more easily manufactured than, more thermally stable than, and/or have a better photophysical properties (e.g., narrower emission band and/ or higher optical yield) than, and/or have other useful physical or chemical properties over, compounds known in the prior art, whether for use in the applications stated herein or otherwise.

Atoms making up the compounds of the present invention are intended to include all isotopic forms of such atoms. Isotopes, as used herein, include those atoms having the same atomic number but different mass numbers. By way of general example and without limitation, isotopes of hydrogen include tritium and deuterium, and isotopes of carbon include $^{13}$C and $^{14}$C.

In some embodiments, the present disclosure provides methods for producing phosphors of the present disclosure. Such methods comprise mixing starting materials of the phosphor to produce a first reaction mixture; heating the first reaction mixture to a first temperature to produce a second reaction mixture; heating the second reaction mixture to a second temperature to produce the phosphor. The starting materials of the phosphor comprise one or more sources of inorganic elements, such as alkali metal sources, alkaline earth metal sources, boron sources, and lathanide sources. Non-limiting examples of alkali metal sources include lithium, sodium, potassium, and rubidium sources, such as sodium salts (e.g., NaHCO$_3$). In some embodiments, the starting materials comprise one or more alkali metal sources. In some embodiments, the one or more alkali metal sources comprise the same alkali metal element (e.g., NaHCO$_3$ and Na$_2$CO$_3$). In some embodiments, the one or more alkali metal sources comprise different alkali metal elements (e.g., NaHCO$_3$ and KHCO$_3$). Non-limiting examples of alkaline earth metal sources include strontium and barium sources, such as barium salts (e.g., BaCO$_3$). Non-limiting examples of boron sources include boric acid (i.e., H$_3$BO$_3$) and borate salts, including but not limited to monoborates, diborates, triborates, and tetraborates. Non-limiting examples of lanthanide sources include europium, cerium, yttrium, terbium, and gadolinium sources, such as europium oxides (e.g., Eu$_2$O$_3$).

Few green phosphors in the art possess a narrow emission band width, mild synthesis conditions, and widely applicable emission coordinates, which are of particular importance for display lighting applications. For example, β-SiAlON:Eu$^{2+}$ is among the narrowest commercial green phosphors; however, its emission coordinates limit the maximum accessible color gamut and its synthesis requires harsh conditions including high-pressure (see Hirosaki et al., 2005, which is incorporated by reference herein). Ba$_{1.14}$Sr$_{0.86}$SiO$_4$:Eu$^{2+}$, another green phosphor, while able to be synthesized under normal atmospheric pressure, exhibits a broad emission band, which precludes its wide applicability (see Denault et al., 2014, which is incorporated by reference herein). The phosphors of the present disclosure may be prepared at atmospheric pressure and exhibit a narrow green emission band (see FIG. 6) and exhibit emission coordinates that are desirable in many applications, such as display lighting (see FIG. 7). In some embodiments, the phosphors of the present disclosure exhibit an emission spectrum peak with a full width at half-maximum (FWHM) of from about 50 nm to about 90 nm, from about 55 nm to about 75 nm, from about 50 to about 70 nm, from about 60 nm to about 70 nm, or from about 50 nm, 55 nm, 60 nm, 65 nm, 70 nm, 75 nm, 80 nm, or 85 nm to about 90 nm, or any range derivable therein. In some embodiments, the FWHM is about 64 nm.

In some embodiments, the first reaction mixture is prepared by combining the starting materials in the appropriate stoichiometric ratios. In some embodiments, the starting materials are mixed and ground by hand using a mortar and pestle. In other embodiments, the starting materials are mixed and ground using mechanical methods including, stirring or blending in a high-speed blender or a ribbon blender, or using a ball mill, a shaker mill, or ajar mill. In some embodiments, mixing further comprises mixing media. Non-limiting examples of mixing media include solvents, such as ethanol. In some embodiments, the first reaction mixture is rested in air before heating. In some embodiments, the first reaction mixture is rested in air for at least 12 hours. In some embodiments, the first reaction mixture is rested in air for at least about 7 days. In some embodiments, the first reaction mixture is rested in air for from about 1 day to about 14 days, from about 3 days to about 12 days, from about 5 days to about 9 days, or for about 7 days before heating. In some embodiments, the first reaction mixture is rested in air for from about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, to about 60 days or any range derivable therein.

In some embodiments, the first reaction mixture is heated at a temperature from about 400° C. to 800° C., from about 500° C. to about 700° C., from about 550° C. to about 650° C., or from about 400° C., 420° C., 440° C., 460° C., 480° C., 500° C., 520° C., 540° C., 560° C., 580° C., 600° C., 620° C., 640° C., 660° C., 680° C., 700° C., 720° C., 720° C., 740° C., 760° C., or 780° C. to about 800° C. or any range derivable therein. In some embodiments, the first reaction temperature is about 600° C. In some embodiments, the second reaction temperature is from about 525° C. to 925° C., from about 625° C. to about 825° C., from about 675° C. to about 775° C., or from about 525° C., 550° C., 575° C., 600° C., 625° C., 650° C., 675° C., 700° C., 725° C., 750° C., 775° C., 800° C., 825° C., 850° C., 875° C., or 900° C., to about 925° C. or any range derivable therein. In some embodiments, the second reaction temperature is about 725° C.

In other embodiments, the first reaction mixture is heated with microwave radiation with a frequency from about 500 MHz to about 4400 MHz, from about 1000 MHz to about 3900 MHz, from about 2000 MHz to about 2900 MHz, or from about 500 MHz, 1000 MHz, 1500 MHz, 2000 MHz, 2500 MHz, 3000 MHz, 3500 MHz, or 4000 MHz to about 4400 MHz, or any range derivable therein. In some embodiments, the power of the microwave radiation is from about 120 W to 1200 W, from about 240 W to about 900 W, from about 360 W to 600 W, or from about 120 W, 240 W, 360 W, 480 W, 600 W, 720 W, 840 W, 960 W, or 1080 W to about 1200 W or any range derivable therein.

In some embodiments, heating the first reaction mixture is performed under an atmosphere of air. In some embodiments, heating the second reaction mixture is performed under a reducing atmosphere. In some embodiments, the reducing atmosphere comprises a reducing gas such as hydrogen, carbon monoxide, ammonia, or any combination thereof. In some embodiments, the reducing atmosphere further comprises a diluent gas, such as nitrogen, helium, neon, argon, krypton, xenon, or any combination thereof. In some embodiments, the reducing atmosphere is produced by heating high-purity carbon particles in air so that the carbon particles react with the oxygen present in air, thereby, generating the reducing gas, carbon monoxide. In some embodiments, the reducing atmosphere comprises $H_2$ and $N_2$. In some embodiments, the reducing atmosphere comprises from about 0.1% to about 25% $H_2$, from about 1% to about 10% $H_2$, or from about 0.1%, 0.2%, 0.3%, 0.4%, 0.5%, 0.6%, 0.7, 0.8%, 0.9%, 1%, 2%, 3%, 4%, 5%, 6%, 7%, 8%, 9%, 10%, 12%, 14%, 16%, 18%, or 20% to about 25% $H_2$ or any range derivable therein. In some embodiments, the reducing atmosphere comprises about 5% $H_2$. In some embodiments, the reducing atmosphere comprises from about 75% to about 99.9% $N_2$, from about 90% to about 99% $N_2$, or from about 75%, 80%, 85%, 90%, 91%, 92%, 93%, 94%, 95%, 96%, 97%, 98%, 99%, 99.1%, 99.2%, 99.3%, 99.4%, 99.5%, 99.6%, 99.7%, 99.8%, to about 99.9% $N_2$ or any range derivable therein. In some embodiments, the reducing atmosphere comprises about 95% $N_2$.

II. Light-Emitting Devices

White light is a mixture of different wavelengths of light, and thus it is possible to characterize white light based on the component colors used to generate it. Different colors may be combined to generate white light, including but not limited to: 1) red, green, and blue, 2) light blue, amber, and lavender, and 3) cyan, magenta, and yellow. Further, a combination of only two colors may be combined to generate light that still appears white to the eye if these two chosen colors are so-called complementary, and an example of this is narrow band sources (LEDs, or in the extreme case, lasers) emitting around 635 nm and 493 nanometers. These artificial whites may appear white to the human eye, but in other ways inferior to full spectrum light and/or natural sunlight in that they will appear artificial when shown on a colored surface.

A classification system developed to characterize the quality of white light, the Color Rendering Index (CRT), was developed in 1965 by the Commission Internationale de l'Eclairage (CIE). A summary of their recommendations is reviewed in U.S. Pat. No. 7,387,405, which is incorporated by reference herein. The CIE advised a measuring the color rendering properties of light sources based on a sample test color method. This method has been updated and is described in "Method of Measuring and Specifying Color Rendering Properties of light sources," 1995, which is incorporated by reference herein. The method involves the spectroradiometric measurement of the light source being tested. This data is multiplied by the reflectance spectrums of eight color sample. The resulting spectrums are then converted to tristimulus values based on the CIE 1931 standard observer. The shift of these values with respect to a reference light are determined for the uniform color space (UCS) recommended in 1960 by the CIE. The average of the eight color shifts is calculated to generate the General Color Rendering Index, known as the CRI. Within these calculations the CRI is scaled so that a perfect score equals 100, where "perfect" means using a source spectrally equal to a reference source (often sunlight and/or full spectrum light).

Artificial lighting generally uses the standard CRI to determine the quality of white light. If a white light yields a high CRI compared to sunlight and/or a full spectrum light, then it is considered to have a better quality in that it is more "natural," and more likely to enable a colored surface to be rendered better. In addition to providing better quality white light, it may also be desirable to produce specific colors of light, because, for example, as natural light tends to be more orange to red in the morning, and bluer in the night or evening, the ability to change, fine-tune, or control a specific color or range of colors within the full spectrum is also important.

In some embodiments, the phosphors of the present disclosure may be used in the manufacture of photoluminescence wavelength conversion materials for solid-state light-emitting devices, including but not limited to LEDs. In some embodiments, the phosphors may be deposited directly onto the LED chips to produce photoluminescence wavelength converted solid-state light emitting devices. In some embodiments, the phosphors of the present disclosure may be used in conjunction with one or more additional phosphors to produce white light and/or to increase the CRI. The additional one or more phosphors may include but are not limited to silicate-based phosphors, aluminate-based phosphors, nitride-based phosphors, sulfate-based phosphors, YAG phosphors or mixtures thereof. In some embodiments, the light-emitting devices of the present disclosure further comprise a red-emitting phosphor and a blue-emitting phosphor. Non-limiting examples of red light-emitting phosphors include $K_2SiF_6:Mn^{4+}$ and nitride-based phosphors, such as those taught in U.S. Pat. No. 8,597,545 or 8,663,502, which are hereby incorporated in their entirety. Non-limiting examples of blue light-emitting phosphors include aluminate-based phosphors, such as $BaMgAl_{10}O_{17}$: $Eu^{2+}$.

III. Definitions

The present disclosure provides inorganic compounds comprising atoms of one or more elements. In the context of the present disclosure, reference to an element is intended to refer to atoms of that element in any oxidation state. A non-limiting example is the term "sodium" (i.e., Na) which refers to both sodium metal (i.e., $Na^0$) and sodium(I) (i.e., $Na^+$).

A "repeat unit" is the simplest structural entity of certain materials, for example, frameworks and/or polymers, whether organic, inorganic or metal-organic. In the case of a polymer chain, repeat units are linked together successively along the chain, like the beads of a necklace. For example, in polyethylene, -[—$CH_2CH_2$—]$_n$-, the repeat unit is —$CH_2CH_2$—. The subscript "n" denotes the degree of polymerization, that is, the number of repeat units linked together. When the value for "n" is left undefined or where "n" is absent, it simply designates repetition of the formula within the brackets as well as the polymeric nature of the material. The concept of a repeat unit applies equally to where the connectivity between the repeat units extends three dimensionally, such as crystalline inorganic materials, metal organic frameworks, modified polymers, thermosetting polymers, etc.

The use of the word "a" or "an," when used in conjunction with the term "comprising" in the claims and/or the specification may mean "one," but it is also consistent with the meaning of "one or more," "at least one," and "one or more than one."

Throughout this application, the term "about" is used to indicate that a value includes the inherent variation of error for the device, the method being employed to determine the value, or the variation that exists among the study subjects or patients. When the term "about" is used in the context of X-ray diffraction peaks, the term is used to express variation in the peak of ±0.2 °2θ.

The terms "comprise," "have," and "include" are open-ended linking verbs. Any forms or tenses of one or more of these verbs, such as "comprises," "comprising," "has," "having," "includes," and "including," are also open-ended. For example, any method that "comprises," "has," or "includes" one or more steps is not limited to possessing only those one or more steps and also covers other unlisted steps.

The term "effective," as that term is used in the specification and/or claims, means adequate to accomplish a desired, expected, or intended result.

An "isomer" of a first compound is a separate compound in which each molecule contains the same constituent atoms as the first compound, but where the configuration of those atoms in three dimensions differs.

The above definitions supersede any conflicting definition in any reference that is incorporated by reference herein. The fact that certain terms are defined, however, should not be considered as indicative that any term that is undefined is indefinite. Rather, all terms used are believed to describe the invention in terms such that one of ordinary skill can appreciate the scope and practice the present invention.

As used herein, one or more of the following abbreviations may be used in the application: LED, light-emitting diode; pc-LED, phosphor-converted while light emitting diode; n-UV, near ultraviolet; FWHM, full width at half-maximum; PLQY or Φ, photoluminescence quantum yield; h, hour; and rt, room temperature.

IV. Examples

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

Example 1: Experimental Procedures and Characterization Data

A. General Information $NaHCO_3$ (99.7%) was procured from EM science, $BaCO_3$ (98%) was procured from Johnson Matthey, $H_3BO_3$ (99.999%) was procured from Sigma-Aldrich, and $Eu_2O_3$ (99.9%) was procured from Materion Advanced Chemicals. Photoluminescent spectra were recorded on a Horiba Fluoromax-4 fluorescence spectrophotometer with a 75 W xenon arc lamp. The sample was mixed into silicone resin (GE Silicones, RTV615) and deposited on a quartz substrate (Chemglass). The luminescence lifetime decay measurements were collected using a Horiba DeltaFlex Lifetime System equipped with a NanoLED N-390 nm LED ($\lambda_{ex}$=392 nm) and a 450 nm long-pass filter. A total measurement length of 13 μs was employed using a repetition rate of 50 kHz and a delay of 10 ns. The absolute internal quantum yield was determined by placing the sample inside a Spectralon-coated integrating sphere (150 mm diameter, Labsphere) and exciting by n-UV through blue light of different wavelengths. The photoluminescence quantum yield (PLQY) was calculated on the basis of disclosed methods (see de Mello et al., 1997; and Leyre et al., 2014, both of which are incorporated by reference herein). Phase purity was confirmed by X-ray powder diffraction on a PanAnalytical X'Pert powder diffractometer using Cu Kα radiation (1.54183 Å).

B. Synthesis of $Na_{0.97}Eu_{0.03}BaB_9O_{15}$ $Na_{0.97}Eu_{0.03}BaB_9O_{15}$ was prepared via solid-state reactions starting from $NaHCO_3$, $BaCO_3$, $H_3BO_3$, and $Eu_2O_3$. The starting materials were loaded in the requisite stoichiometric ratios, thoroughly ground using an agate mortar and pestle, and allowed to rest in air for various amounts of time. In some experiments, the starting materials were allowed to rest for 7 days after mixing. Without wishing to be bound by any particular theory, the resting period may facilitate a pre-reaction, evidence for which is visible in FIG. 1. The pre-reaction is visible 5 days after mixing, as noted by the significant increase in new peaks in the diffractogram. These new peaks continue to grow in intensity while the original large peaks near ~25° and ~30° 2θ to decrease in prominence. This process continues for about 30 days when the pre-reaction mixture stabilizes. The minimum waiting time necessary to maximize the production of the green-emitting phosphor appears to be ~7 days. The X-ray powder diffractograms of the starting mixture over time are shown in FIG. 1. This pre-reaction mixture was then subsequently sintered at 600° C. for 2 h in air to decompose the reagents and initiate the reaction. The samples were then ground and heated at 725° C. for 30 h using a fused silica tube furnace under a weak reducing atmosphere (5% $H_2$/95% $N_2$) with heating and cooling ramps of 3° C. $min^{-1}$.

Alternatively, $Na_{0.97}Eu_{0.03}BaB_9O_{15}$ may be prepared via a microwave-assisted solid-state reaction. After resting the mixture of the initial starting materials for approximately 7 days, the resulting pre-reaction mixture was loaded into a graphite crucible that was centered in a larger alumina crucible with activated carbon packed into the annular space and covered by a graphite cap to maintain a reducing atmosphere comprising carbon monoxide produced by the hot carbon. The whole apparatus was then loaded into a microwave oven and reacted at ~480 W and ~2450 Hz for 8 min.

C. Characterization and Photophysical Data

Figure 2:
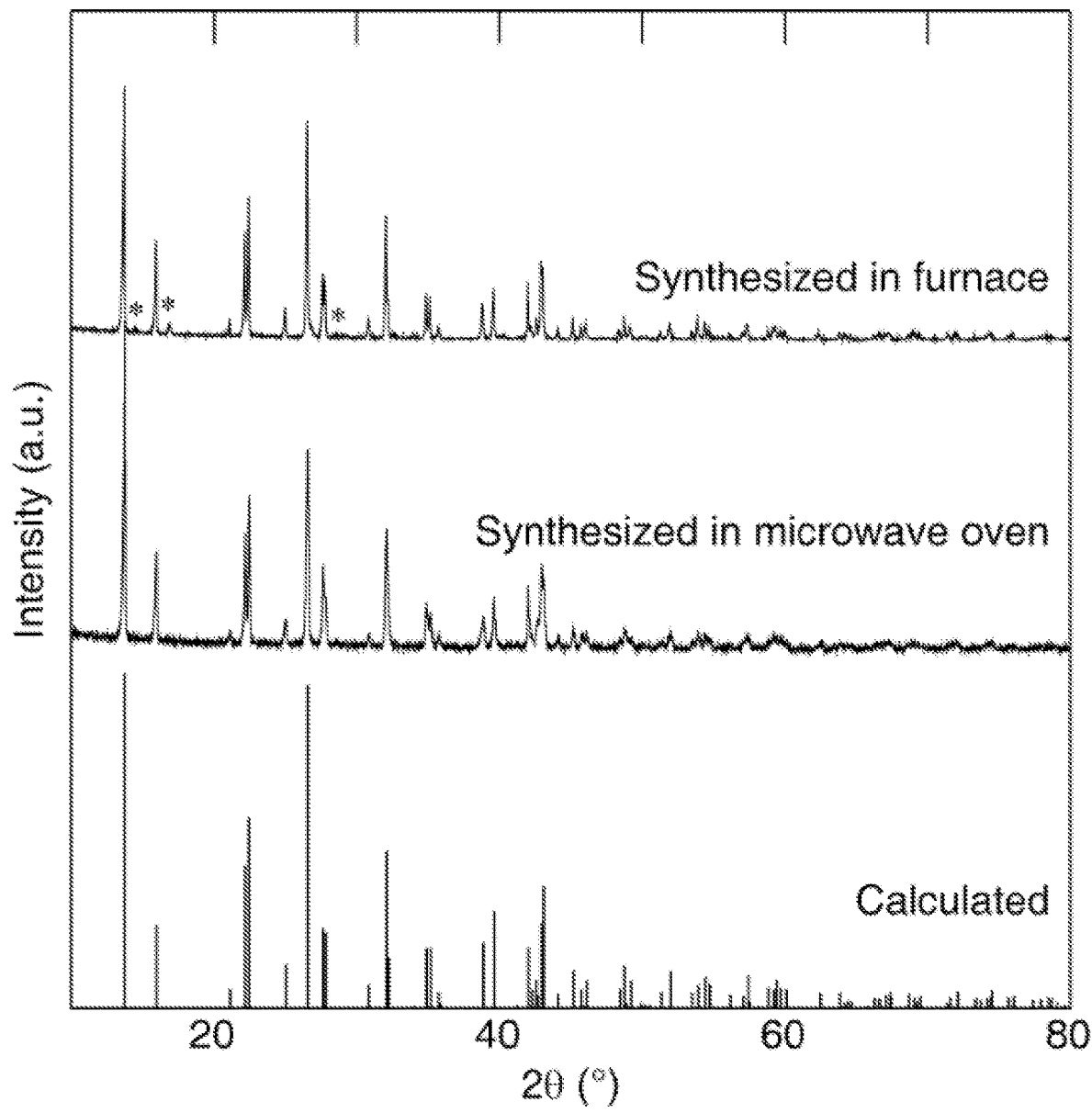
FIG. 2 shows XRD patterns of NBBO:Eu$^{2+}$ prepared using a furnace route and a microwave-based route. The calculated pattern is shown on the bottom of the spectrum. Impurity (BaB$_8$O$_{13}$) peaks are marked by asterisks.
Figures 3A, 3B, 3C:
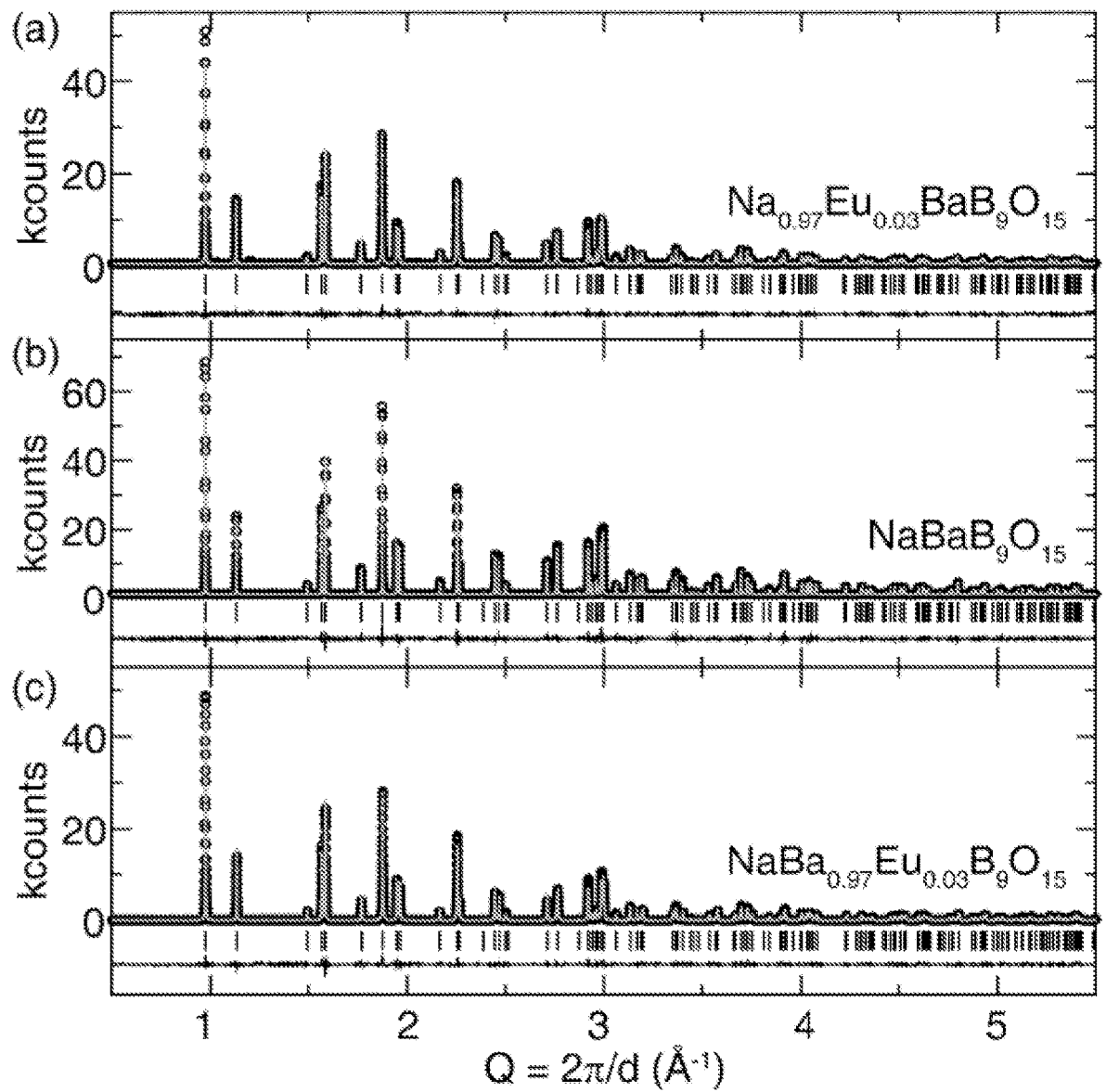
FIGS. 3A-3C show the Rietveld refinement of synchrotron X-ray powder diffraction data. The observed data are in black circles, the fit is colored gray, the difference between the data and the fit is shown by black curve, and the Bragg positions are black bars.
Figures 4A, 4B:
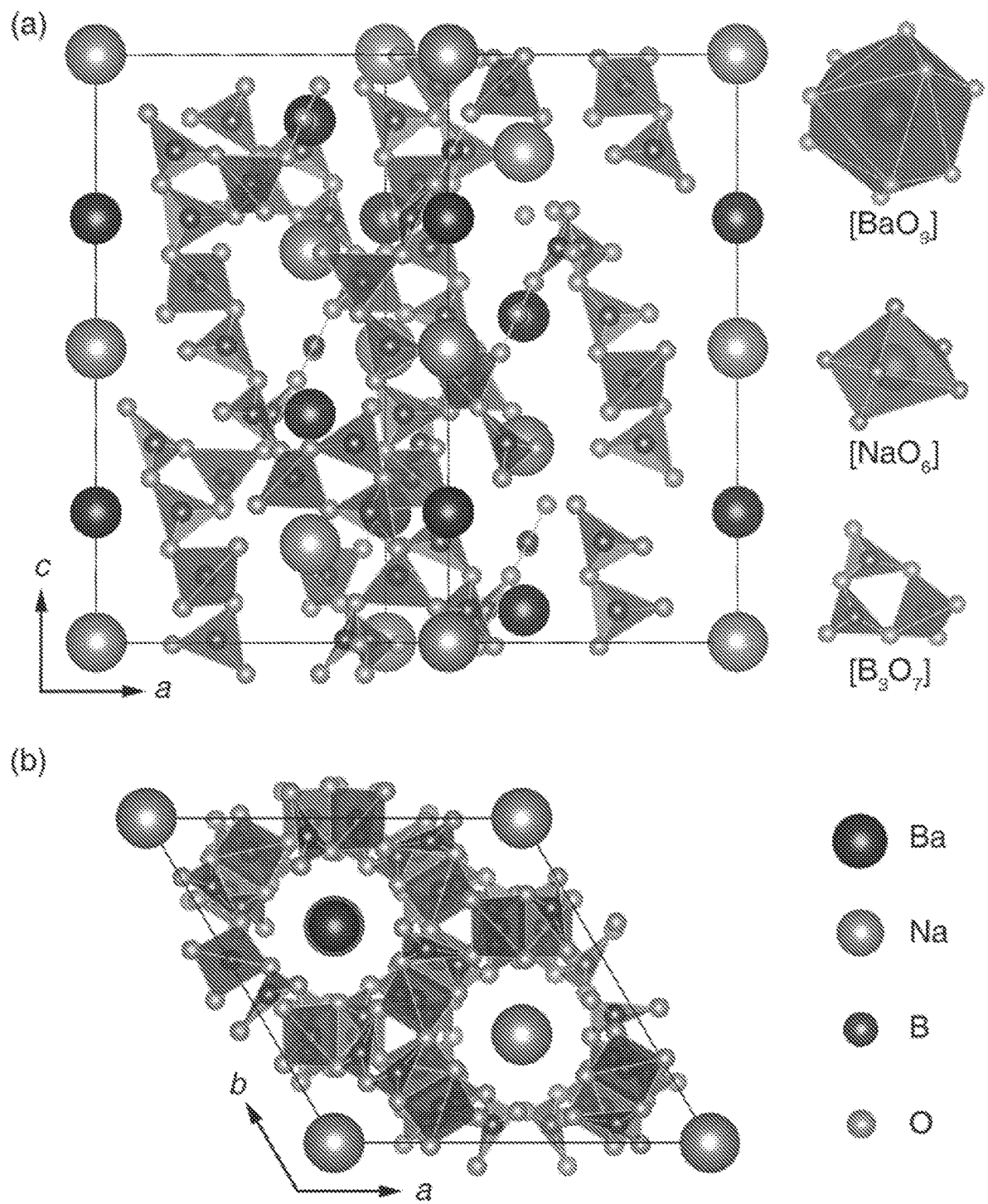
FIGS. 4A & 4B show the crystal structure of NaBaB$_9$O$_{15}$.

The synthesis of $NaBaB_9O_{15}$:$Eu^{2+}$ (NBBO:$Eu^{2+}$) used a high-temperature ceramic route starting from the oxide powders. According to the X-ray powder diffractograms, shown in FIG. 2, most of the peaks can be indexed to calculated $NaBaB_9O_{15}$ pattern. The small amount of tiny impurity peaks, marked by asterisks, belongs to $BaB_8O_{13}$, whose emission is not observed in the following optical characterizations. $NaBaB_9O_{15}$ adopts the non-centrosymmetric trigonal space group R3c (no. 161). As illustrated in FIG. 4, the crystal structure contains a three-dimensional framework of $[B_3O_7]^{5-}$ subunits in which two $[BO_3]^{3-}$ trigonal planar units and one $[BO_4]^{5-}$ tetrahedron are linked by the vertices. The arrangement of the $[B_3O_7]^{5-}$ units generates large tunnels along the [001] direction that are occupied by $Ba^{2+}$ and $Na^+$ alternatively. The $Ba^{2+}$ ions are coordinated in a nine-vertex distorted tri-capped trigonal prism, whereas six oxygen atoms form a highly distorted trigonal antiprism surrounding the $Na^+$ ions. The $Eu^{2+}$ substitutes for a small amount of $Na^+$ in this case.

According to Rietveld refinements on the synchrotron X-ray diffraction data (FIGS. 4A-4C and Table 1), $Na_{0.97}Eu_{0.03}BaB_9O_{15}$ has the largest unit cell volume among $NaBaB_9O_{15}$ and $NaBa_{0.97}Eu_{0.03}B_9O_{15}$, because smaller $Na^+$ is substituted by larger $Eu^{2+}$. Owing to the larger size of $Ba^{2+}$ than $Eu^{2+}$, $NaBa_{0.97}Eu_{0.03}B_9O_{15}$ possesses the smallest unit cell. These data support that the substitution of $Eu^{2+}$ for $Na^+$ produce discrete and discernable difference from the case where $Eu^{2+}$ substitutes for $Ba^{2+}$.

TABLE 1

Refined crystallographic data of $Na_{0.97}Eu_{0.03}BaB_9O_{15}$, $NaBaB_9O_{15}$, and $NaBa_{0.97}Eu_{0.03}B_9O_{15}$.

| Formula | $Na_{0.97}Eu_{0.03}BaB_9O_{15}$ | $NaBaB_9O_{15}$ | $NaBa_{0.97}Eu_{0.03}B_9O_{15}$ |
|---|---|---|---|
| Radiation type; λ (Å) | Synchrotron radiation; 0.412824 | Synchrotron radiation; 0.457667 | Synchrotron radiation; 0.412824 |
| Lattice parameters (Å) | a = 11.10911(7)<br>c = 17.39509(6) | a = 11.10166(6)<br>c = 17.40089(4) | a = 11.09060(1)<br>c = 17.41663(6) |
| Unit cell volume (Å³) | 1859.15(9) | 1857.28(5) | 1855.26(1) |
| Profile R-factor, $R_p$ | 0.0840 | 0.0739 | 0.0874 |
| Weighted profile R-factor, $R_{wp}$ | 0.1090 | 0.0907 | 0.1144 |

Figure 5:
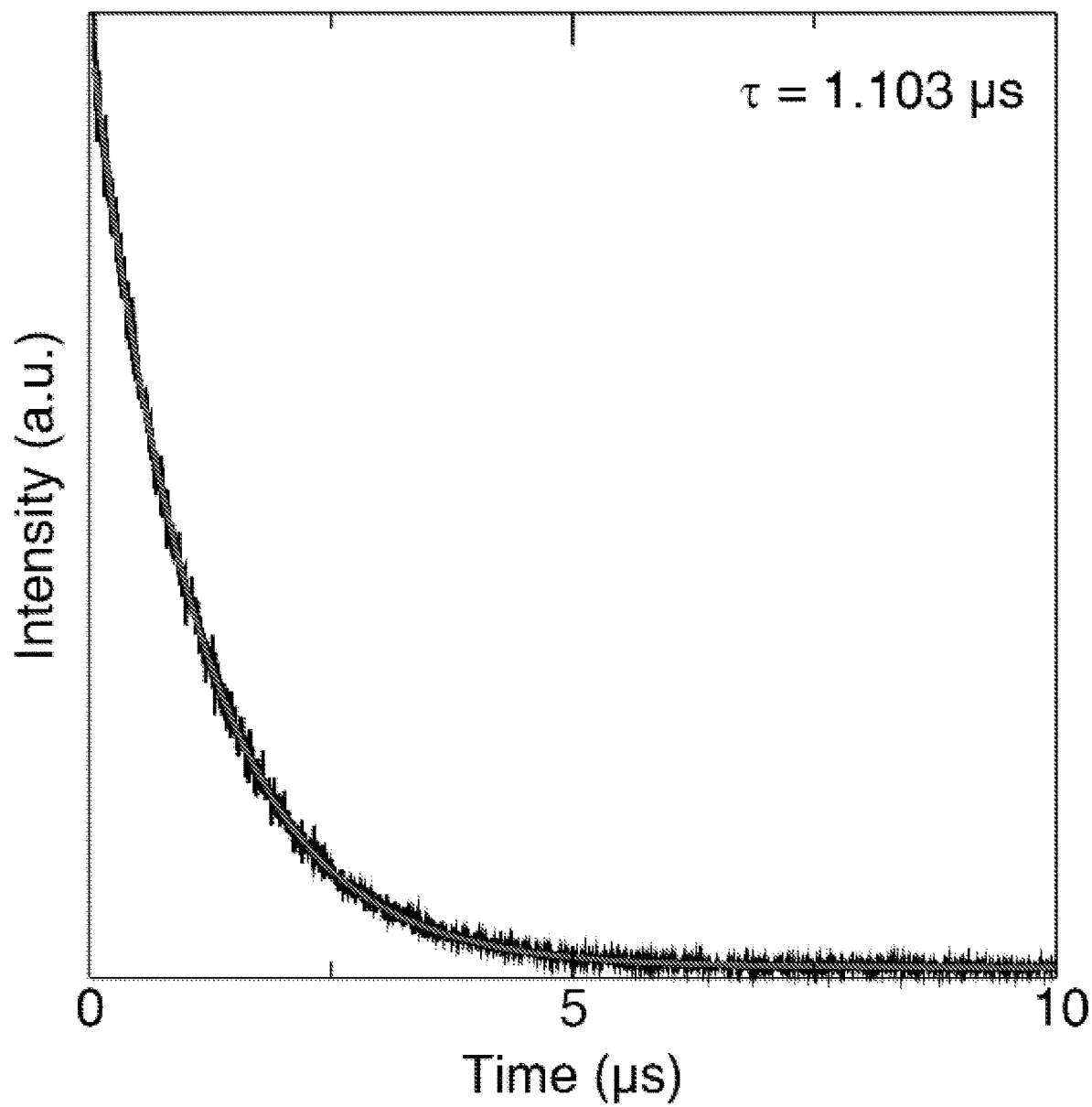
FIG. 5 shows the luminescence decay curve of NBBO:Eu$^{2+}$. The fit line is obtained following Equation 1 to obtain the decay time ($\tau$).

The single $Eu^{2+}$ site can also be supported by measuring the photoluminescence lifetime, as shown in FIG. 5. The data could be fit with a single exponential function described in Eq. 1:

$$I = I_0 + Ae^{\frac{-t}{\tau}}, \quad (1)$$

where I is the luminescent intensity, t is time, A is a pre-exponential factor, and τ is the decay time, to reveal that the luminescence decay occurs with a 1.103 μs decay time.

Figure 6:
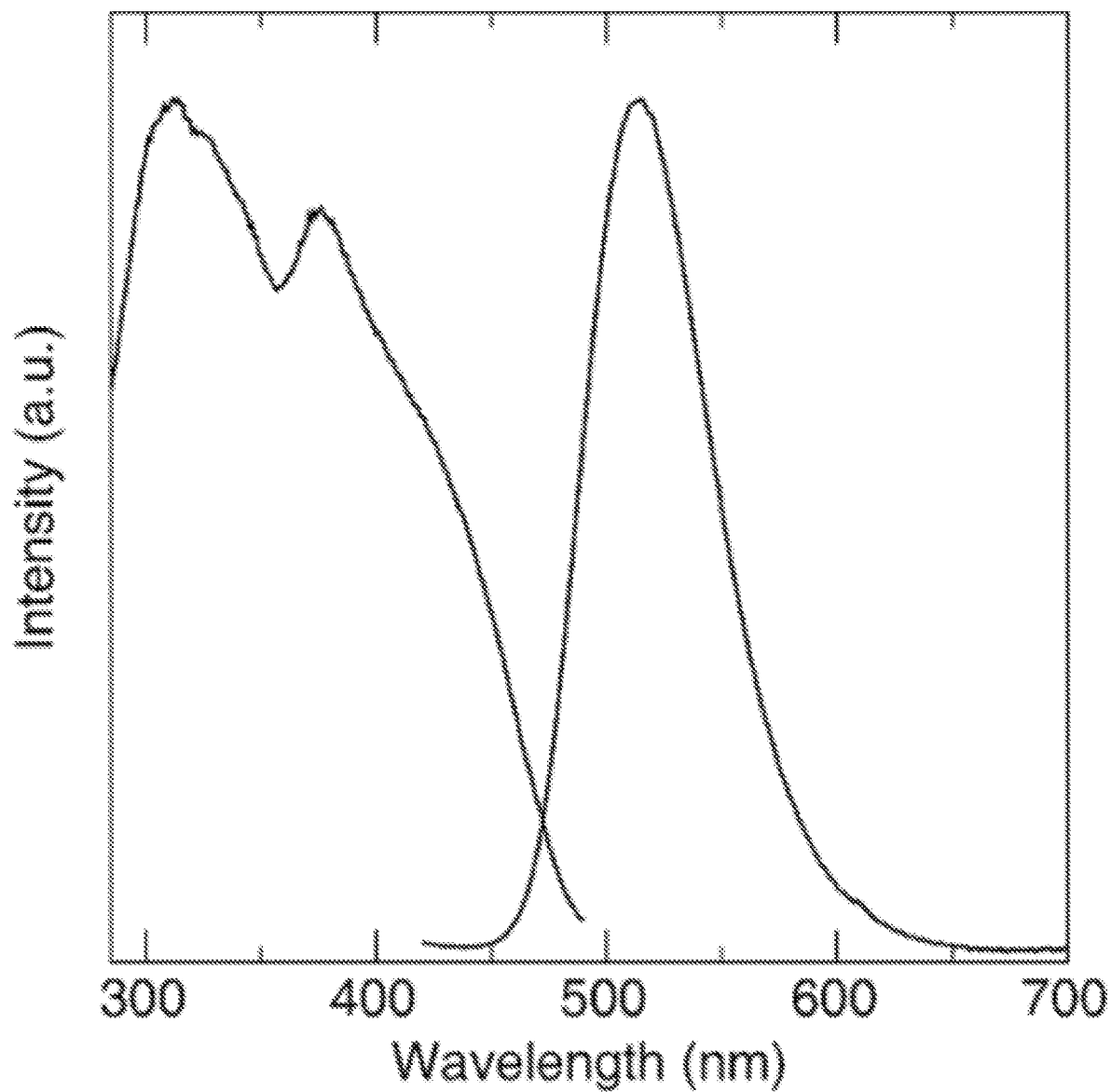
FIG. 6 shows the room temperature excitation spectrum (left line with lesser peak at 395 nm) and emission (right line with peak at 515 nm) spectra of NBBO:Eu$^{2+}$. Emission spectrum was obtained upon excitation at 395 nm.
Figure 7:
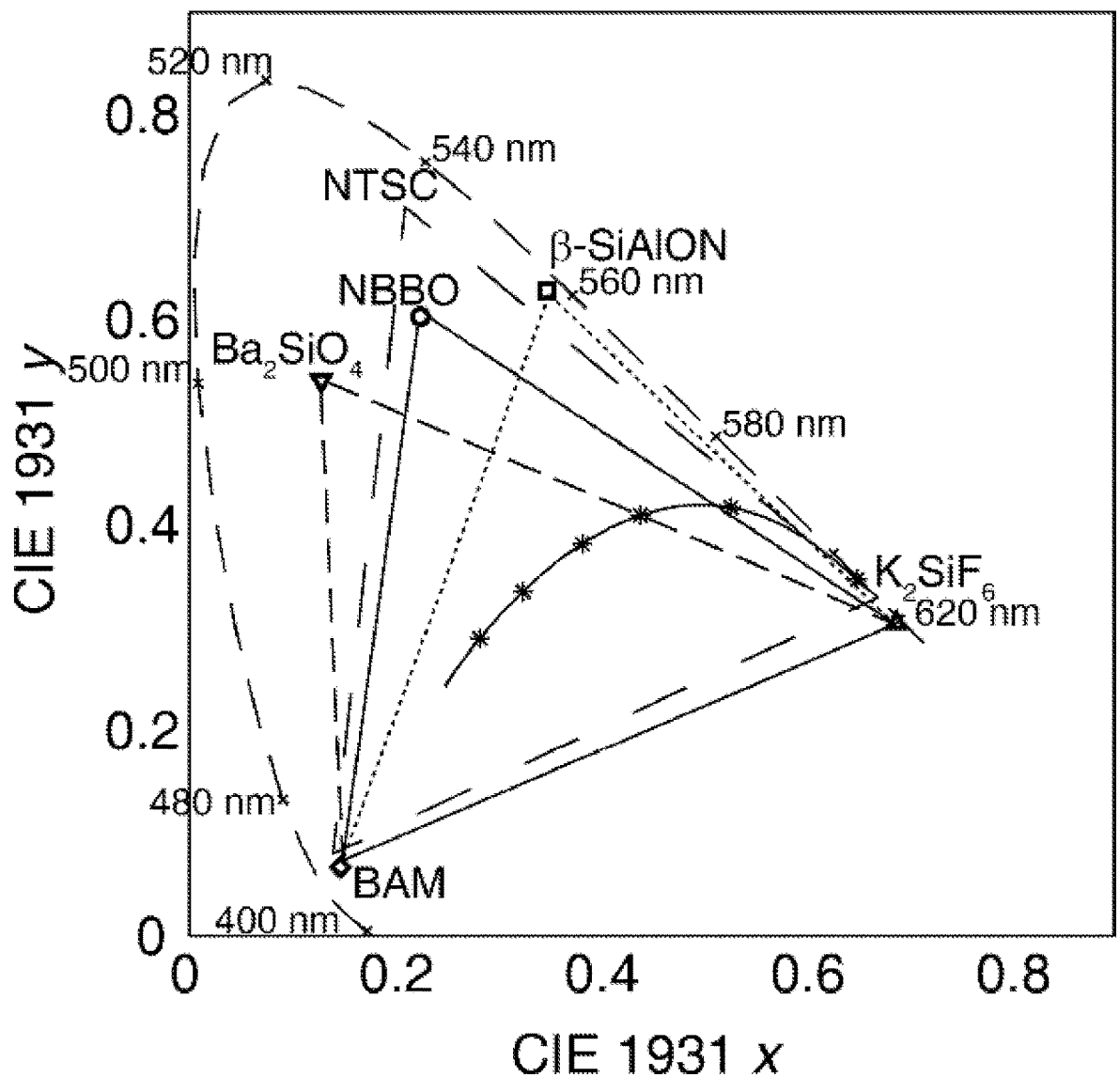
FIG. 7 shows the room temperature CIE coordinates of NBBO:Eu$^{2+}$ excited at 395 nm (circle), Ba$_2$SiO$_4$:Eu$^{2+}$ (nabla), β-SiAlON:Eu$^{2+}$ (square), BAM:Eu$^{2+}$ (diamond), and K$_2$SiF$_6$:Mn$^{4+}$ (triangle). Plotted in with dashed lines and without marker symbols is the NTSC color space.

Substituting $Eu^{2+}$ for $Na^+$ in the structure leads to photoluminescence upon excitation with light ranging from 280 nm to ~480 nm, making NBBO:$Eu^{2+}$ exceptionally versatile as it can be excited by a plethora of sources throughout the UV to blue regions of the electromagnetic spectrum. The emission spectrum is also depicted in FIG. 6 when $\lambda_{ex}$=395 nm, showing a narrow emission band with a maximum centered at 515 nm and a full width at half-maximum (fwhm) of approximately 64 nm. The narrow fwhm of this phosphor is comparable to the current narrowest green commercial phosphor, β-SiAlON:Eu$^{2+}$ (fwhm=55 nm), and is significantly narrower than most other green phosphors including the well-known Ba$_2$SiO$_4$:Eu$^{2+}$ (fwhm=80 nm) and Y$_3$(Al,Ga)$_5$O$_{12}$:Ce$^{3+}$ (120 nm). NBBO:Eu$^{2+}$ emission spectrum were also measured using blue excitation sources (λ$_{ex}$=430 nm and 450 nm respectively) and found to exhibit the same peak shape and peak position, with the narrow emission maintained similar to excitation at shorter wavelengths.

Besides its narrow fwhm, the NBBO:Eu$^{2+}$ has other advantages that can be best understood by analyzing the room temperature emission spectrum with the tristimulus function. Plotting the color coordinates of NBBO:Eu$^{2+}$ (λ$_{ex}$=395 nm), the industry standard green phosphors β-SiAlON:Eu$^{2+}$ and Ba$_2$SiO$_4$:Eu$^{2+}$ on a 1931 CIE diagram, illustrated in FIG. 7, allows for comparison of the raw color of these three phosphors. Ba$_2$SiO$_4$:Eu$^{2+}$ is on the very left of the color space among these three due to its shorter emission wavelength, which gives its emission a blue hint, which diminishes the color purity. β-SiAlON:Eu$^{2+}$, however, emits an almost monochromatic light but contains some yellow component in it. Moreover, its harsh synthetic condition determines the high price of this phosphor in market. Both β-SiAlON:Eu$^{2+}$ and Ba$_2$SiO$_4$:Eu$^{2+}$ lie outside the National Television System Committee (NTSC) color triangle, which makes them off the standard and decreases the color quality in real application. On the other hand, NBBO:Eu$^{2+}$ is clearly located in between Ba$_2$SiO$_4$:Eu$^{2+}$ and β-SiAlON:Eu$^{2+}$ in the color space, which moves this new phosphor's emission color closer to the green corner of the NTSC triangle, as shown, providing the potential to use this material in display applications. To ascertain the available color gamut by incorporating NBBO:Eu$^{2+}$, the CIE coordinates of blue-emitting BaMgAl$_{10}$O$_{17}$:Eu$^{2+}$ (BAM:Eu$^{2+}$) and red-emitting K$_2$SiF$_6$:Mn$^{4+}$ were also plotted. Comparing the area of the resulting triangle created by connecting the coordinates for BAM:Eu$^{2+}$—NBBO:Eu$^{2+}$—K$_2$SiF$_6$:Mn$^{4+}$ with the triangle created by BAM:Eu$^{2+}$-β-SiAlON:Eu$^{2+}$—K$_2$SiF$_6$:Mn$^{4+}$ and BAM:Eu$^{2+}$—Ba$_2$SiO$_4$:Eu$^{2+}$—K$_2$SiF$_6$:Mn$^{4+}$ shows that using NBBO:Eu$^{2+}$ widens the color gamut by 6% and 4% than if β-SiAlON:Eu$^{2+}$ and Ba$_2$SiO$_4$:Eu$^{2+}$ were used. Further, the triangle formed using NBBO:Eu$^{2+}$ as the green phosphor has an area that overlaps 78% of the NTSC area. This is a broader area than a device using β-SiAlON:Eu$^{2+}$ (69% of NTSC area) and Ba$_2$SiO$_4$:Eu$^{2+}$ (68% of NTSC area) by permitting more color in the green wavelength region.

Figure 8:
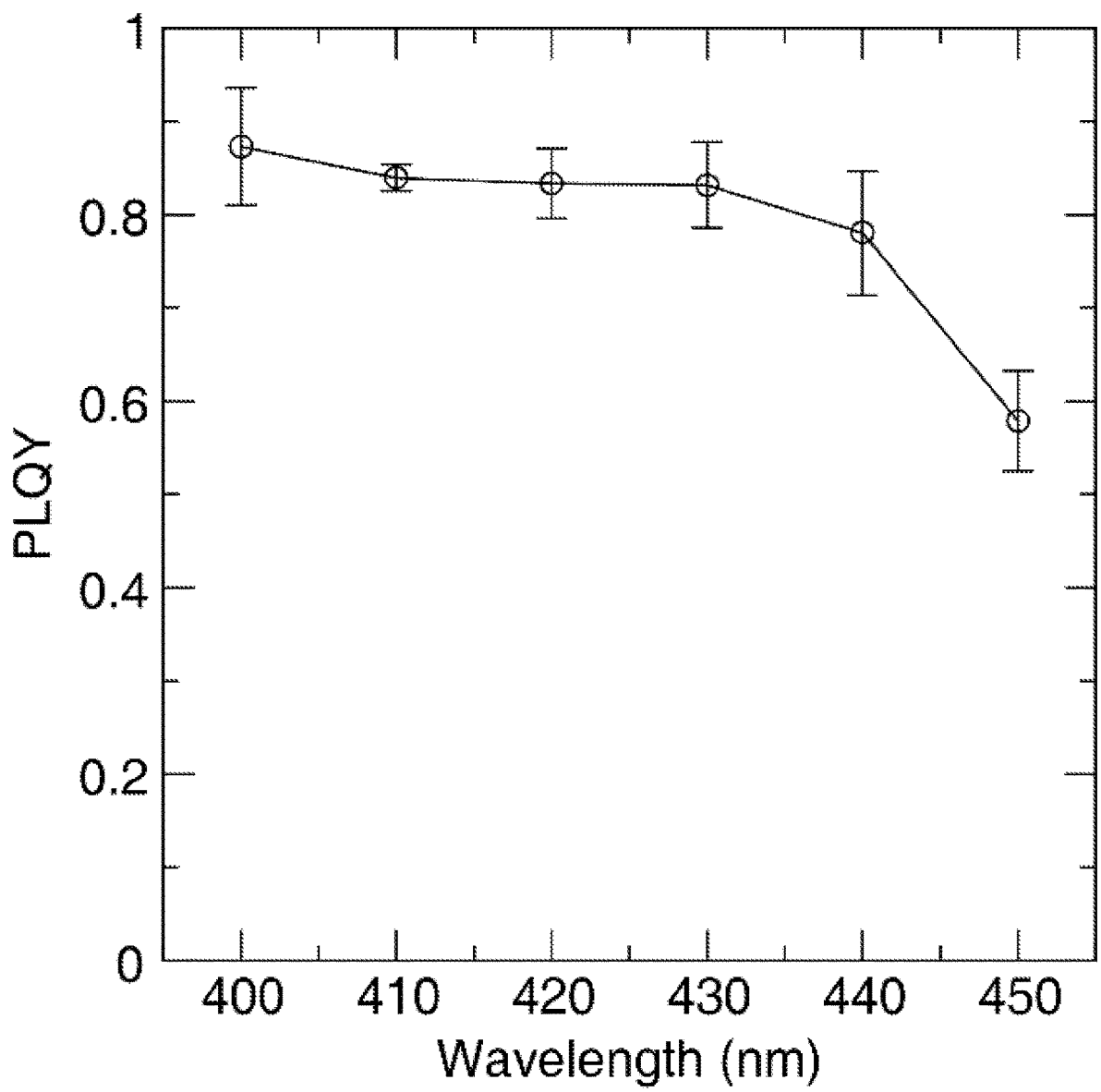
FIG. 8 shows the room temperature photoluminescence quantum yield ($\Phi$) values of NBBO:Eu$^{2+}$ excited at different wavelengths.

Although this phosphor has a narrow emission spectrum, to be useful, NBBO:Eu$^{2+}$ must also have a high efficiency. Therefore, the room temperature photoluminescence quantum yield (Φ) was measured to assess the phosphor's internal efficiency. Because of the wide excitation spectrum, the Φ was calculated using multiple excitation wavelengths to understand its efficiency across n-UV to blue region. As presented in FIG. 8, the Φ for this phosphor using λ$_{ex}$=400 nm exhibits a high Φ nearly 90%, which should allow this compound to be a viable green component in devices employing a 400 nm LED chip. Exciting at a slightly longer wavelength (λ$_{ex}$=410 nm) causes a minor decrease in the Φ to 83%, which can retain up to λ$_{ex}$=430 nm. Further red shifting the excitation source decreases the Φ. However, this phosphor still maintains an Φ of nearly 60% when excited by blue light (λ$_{ex}$=450 nm). The optical properties of NBBO:Eu$^{2+}$ across the n-UV to blue region, narrow emission peak, and green color coordinates indicate that this new green phosphor may find wide use in devices employing n-UV and blue excitation.

All of the compositions and methods disclosed and claimed herein can be made and executed without undue experimentation in light of the present disclosure. While the compositions and methods of this disclosure have been described in terms of preferred embodiments, it will be apparent to those of skill in the art that variations may be applied to the compositions and methods and in the steps or in the sequence of steps of the method described herein without departing from the concept, spirit and scope of the disclosure. More specifically, it will be apparent that certain agents which are both chemically and physiologically related may be substituted for the agents described herein while the same or similar results would be achieved. All such similar substitutes and modifications apparent to those skilled in the art are deemed to be within the spirit, scope and concept of the disclosure as defined by the appended claims.

V. References

The following references to the extent that they provide exemplary procedural or other details supplementary to those set forth herein, are specifically incorporated herein by reference.

U.S. Pat. No. 7,387,405
U.S. Pat. No. 8,597,545
U.S. Pat. No. 8,663,502
Commission Internationale de l'Eclairage, "Method of Measuring and Specifying Color Rendering Properties of light sources," 13(3), 1995.
Cotton and Wilkinson, *Advanced Inorganic Chemistry*, 5$^{th}$ ed., 1988.
de Mello et al., *Adv. Mater.*, 9:230-232, 1997.
Denault et al., *Chem. Mater.*, 26:2275-2282, 2014.
Hirosaki et al., *Appl. Phys. Lett.*, 86:211905, 2005.
Leyre et al., *Rev. Sci. Instrum.*, 85:123115, 2014.

What is claimed is:

1. A phosphor of the general molecular formula:

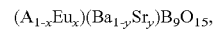

$(A_{1-x}Eu_x)(Ba_{1-y}Sr_y)B_9O_{15}$, wherein:
A is one or more alkali metal;
0<x≤0.25; and
0≤y≤1.

2. The phosphor of claim 1, wherein A is sodium (I).
3. The phosphor of claim 1, wherein 0≤y≤0.75.
4. The phosphor according to claim 1, wherein 0<x≤0.15.
5. The phosphor according to claim 1, further defined as Na$_{0.97}$Eu$_{0.03}$BaB$_9$O$_{15}$.
6. The phosphor according to claim 1, wherein the phosphor has an excitation spectrum peak at an excitation wavelength from about 350 nm to about 450 nm.
7. The phosphor according to claim 1, wherein the phosphor has an emission spectrum peak at an emission wavelength from about 450 nm to about 550 nm.
8. The phosphor according to claim 1, wherein the emission spectrum peak has a full width at half-maximum (FWHM) of from about 50 nm to about 90 nm.
9. A method for producing a phosphor according to claim 1, wherein the method comprises:
   a) mixing starting materials of the phosphor to produce a first reaction mixture, wherein the starting materials of the phosphor comprise one or more alkali metal sources, a barium source, a boron source, and a europium source;
   b) heating the first reaction mixture to a first temperature to produce a second reaction mixture; and c) heating the second reaction mixture to a second temperature to produce the phosphor.

10. The method according to claim 9, wherein the second temperature is from about 525° C. to 925° C.

11. The method according to claim 9, wherein heating the second reaction mixture is performed in a reducing atmosphere.

12. A method for producing a phosphor according to claim 1, wherein the method comprises:
   a) mixing starting materials of the phosphor to produce a first reaction mixture, wherein the starting materials of the phosphor comprise one or more alkali metal sources, a barium source, a boron source, and a europium source;
   b) heating the first reaction mixture to produce the phosphor.

13. The method of claim 12, wherein heating the first reaction mixture comprises irradiating the first reaction mixture with microwave radiation.

14. The method of claim 12, wherein the frequency of the microwave radiation is from about 500 MHz to about 4400 MHZ.

15. The method according to claim 12, wherein the power of the microwave is from about 120 W to about 1200 W.

16. The method according to claim 12, wherein the alkali metal source is a sodium source is a sodium salt.

17. The method according to claim 12, wherein the barium source is a barium salt.

18. The method according to claim 12, wherein the boron source is $H_3BO_3$.

19. The method according to claim 12, wherein the europium source is a europium salt.

20. The method according to claim 12, wherein the first temperature is from about 400° C. to 800° C.

21. The method according to claim 12, wherein mixing is performed in air and heating the first reaction mixture is performed in air or in a reducing atmosphere.

22. The method according to claim 12, wherein the reducing atmosphere comprises $H_2$, CO, or $NH_3$, and optionally further comprises a diluent gas.

23. The method according to claim 12, wherein the method further comprises resting the first reaction mixture for at least about 12 hours before heating.

24. A light-emitting device comprising:
   a) an excitation light source that emits primary light; and
   b) a phosphor according to claim 1, wherein the phosphor is a green-emitting phosphor.

25. The light-emitting device of claim 24, wherein the excitation light source is a semiconductor light source.

26. The light-emitting device of claim 24, wherein the primary light has a wavelength from about 380 nm to about 500 nm.

27. The light-emitting device according to claim 24, wherein the light-emitting device further comprises a blue-emitting phosphor, a red-emitting phosphor, or a combination thereof.

* * * * *